United States Patent
Singh et al.

(12) 
(10) Patent No.: US 6,187,666 B1
(45) Date of Patent: Feb. 13, 2001

(54) CVD PLASMA PROCESS TO FILL CONTACT HOLE IN DAMASCENE PROCESS

(75) Inventors: Bhanwar Singh, Morgan Hill; Michael K. Templeton, Atherton; Bharath Rangarajan, Santa Clara; Christopher F. Lyons, Fremont; Sanjay K. Yedur, Santa Clara; Ramkumar Subramanian, San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/328,148

(22) Filed: Jun. 8, 1999

(51) Int. Cl.⁷ .............................................. H01L 21/4763
(52) U.S. Cl. .......................................... 438/633; 438/633
(58) Field of Search .................................. 433/622, 637, 433/638, 639, 640, 440, 431, 687, 783, 618, 625, 633, 424, 444, 445

(56) References Cited

U.S. PATENT DOCUMENTS

| | | |
|---|---|---|
| 5,635,423 * | 6/1997 | Huang et al. . |
| 5,686,354 * | 11/1997 | Avanzino et al. . |
| 5,691,238 | 11/1997 | Avanzino et al. . |
| 5,693,568 | 12/1997 | Liu et al. . |
| 5,705,430 | 1/1998 | Avanzino et al. . |
| 5,795,823 | 8/1998 | Avanzino et al. . |
| 5,933,748 * | 8/1999 | Chou et al. ............... 438/431 |
| 5,933,761 * | 8/1999 | Lee ........................... 438/783 |
| 5,940,718 * | 8/1999 | Biok et al. ................ 438/440 |
| 5,989,997 * | 11/1999 | Lin et al. .................. 438/622 |
| 6,027,994 * | 2/2000 | Huang et al. ............. 438/618 |
| 6,040,243 * | 3/2000 | Li et al. .................... 438/687 |

* cited by examiner

*Primary Examiner*—David Nelms
*Assistant Examiner*—David Nhu
(74) *Attorney, Agent, or Firm*—Amin, Eschweiler & Turocy, LLP

(57) ABSTRACT

The present invention relates to a method for fabricating interconnecting lines and vias in a layer of insulating material. A via is formed in the layer of insulating material. A protective material is formed so as to be conformal to at least edges and sidewalls of the via, the protective material facilitating shielding of at least the edges and sidewalls of the via from a trench etch step. The trench etch step is performed to form a trench opening in the insulating material. The via and trench are filled with a conductive metal.

14 Claims, 6 Drawing Sheets

US 6,187,666 B1

CVD PLASMA PROCESS TO FILL CONTACT HOLE IN DAMASCENE PROCESS

TECHNICAL FIELD

The present invention generally relates to semiconductor processing, and in particular to a method for improving a dual damascene process.

BACKGROUND OF THE INVENTION

The escalating requirements for density and performance associated with ultra large scale integration (ULSI) circuits require responsive changes in interconnection technology which is considered a very demanding aspect of ULSI technology. High density demands for ULSI integration require planarizing layers with minimal spacing between conductive lines.

Single damascene is a technique developed to address disadvantages (e.g., poor metal step coverage, residual metal shorts, low yields, uncertain reliability, and poor ULSI integration extendability) associated with traditional etch back methods. Damascene, an art which has been employed for centuries in the fabrication of jewelry, has been adapted for application in the semiconductor industry. Damascene basically involves the formation of a trench which is filled with a metal. Thus, damascene differs from traditional etch back methods which involve building up a metal wiring layer and filling the interwiring spaces with a dielectric material.

Single damascene techniques offer the advantage of improved planarization as compared to etch back methods; however, single damascene is time consuming in that numerous process steps are required. Undesirably, an interface exists between the conductive via and conductive wiring. Moreover, adequate planarization layers containing an interwiring spacing less than 0.35 μm are difficult to achieve.

An improvement to single damascene is dual damascene which involves substantially simultaneous formation of a conductive via and conductive wiring. The dual damascene technique requires less manipulative steps than the single damascene technique and eliminates the interface between the conductive via and conductive wiring which is typically formed by the single damascene technique. In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect active and/or passive elements of the integrated circuit. The dual damascene process also is used for forming multilevel signal lines of metal, such as copper, in the insulating layers, such as polyimide, of multilayer substrate on which semiconductor devices are mounted.

A conventional dual damascene process is illustrated in FIGS. 1a–1h in connection with a semiconductor structure 18. FIG. 1a illustrates an insulative layer 20 formed on a semiconductor substrate (not shown). A photoresist layer 22a is formed on the insulative layer 20. The photoresist layer 22a is patterned using conventional techniques to form a first opening 30 (FIG. 1b). Anisotropic reactive ion etching (RIE) is performed to form a via 40 (FIG. 1c) in the insulative layer 20. Subsequently, a second layer of photoresist 22b (FIG. 1d) is formed over the structure 18.

The second photoresist layer 22b is patterned to form a second opening 48 (FIG. 1e) about the size of the ultimate trench. Anisotropic RIE is again performed to form a trench 50 (FIG. 1f) in the insulative layer 20. Although this standard dual damascene technique offers advantages over other processes for forming interconnections, it has a number of disadvantages, such as the edges of the via openings and the sidewalls of the via 40 in the lower half of the insulating layer 20 are poorly defined because of the two etchings and the via edges and sidewalls being unprotected during the second etching. More particularly, gases from the second etch step leak under photoresist portion 22c and damage edges and sidewalls of the via 40 as illustrated in FIGS. 1g and 1h.

In view of the above, improvements are needed to mitigate poor edge and sidewall definition of vias associated with conventional dual damascene processes.

SUMMARY OF THE INVENTION

The present invention relates to a method for mitigating poor edge and sidewall definition in vias common to conventional dual damascene processes by employing a conformal insulating layer to protect edges and sidewalls of a via from exposure to a second etch step (to form trenches). In particular, after a first etch step to define a via, a conformal layer of insulating material is formed to insulate edges and sidewalls of the via. The conformal layer protects the via edges and sidewalls from exposure to reactive gases of the second etch step. After the second etch step is substantially complete, the conformal layer is removed to leave a dual damascene structure (trench and via) which has improved via edge and sidewall definition as compared to many structures formed under conventional dual damascene methodologies.

One aspect of the invention relates to a method for fabricating interconnecting lines and vias in a layer of insulating material. A via is formed in the layer of insulating material. A protective material is formed so as to be conformal to at least edges and sidewalls of the via. The protective material facilitates shielding of at least the edges and sidewalls of the via from a trench etch step which is performed to form a trench opening in the insulating material.

Another aspect of the present invention relates to a dual damascene structure, including: an insulating material; a via formation in the insulating material; a protective layer covering at least sidewalls of the via formation; and a conductive line trench formation.

Still another aspect of the present invention relates to a dual damascene structure, including: an insulating material; a via formation in the insulating material; and means for insulating at least edges and sidewalls of the via formation from an etch step to form a conductive line trench formation.

Yet another aspect of the present invention relates to a method for fabricating interconnecting lines and vias in a layer of insulating material. A first photoresist layer is formed on the insulating material. The insulating material includes at least one of: silicon oxide (SiO), silicon dioxide (SiO$_2$), silicon nitride (Si$_3$N$_4$), (SiN), silicon oxynitride (SiO$_x$N$_y$), fluonated silicon oxide (SiO$_x$F$_y$), and polyimide (s). The first photoresist layer is patterned to define a via The via is formed in the layer of insulating material. A protective material is formed so as to be conformal to at least edges and sidewalls of the via The protective material facilitates shielding of at least the edges and sidewalls of the via from a trench etch step. The protective material includes at least one of: a nitride and a polymer. Excess portions of the first photoresist layer and protective material are removed. A second photoresist layer is formed on the insulating material. The second photoresist layer is patterned to define a trench. The trench etch step is performed to form the trench in the insulating material. The via and trench are filled with a conductive metal.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
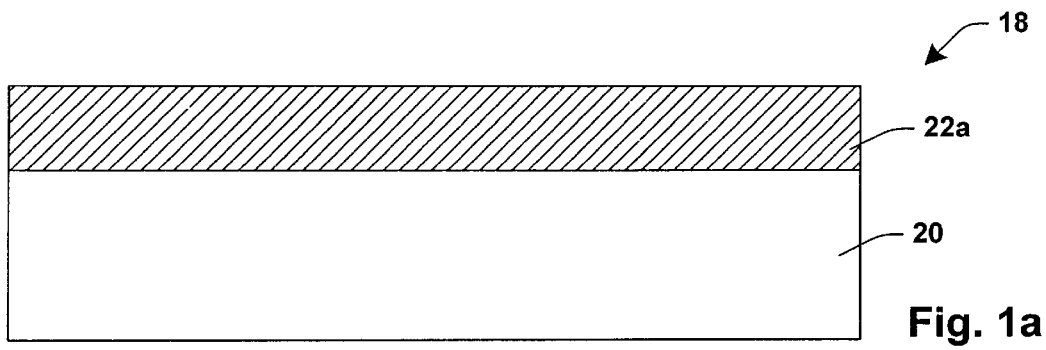
FIG. 1a is a schematic illustration of an oxide layer covered with a photoresist layer in accordance with a conventional dual damascene process.
Figure 1B:
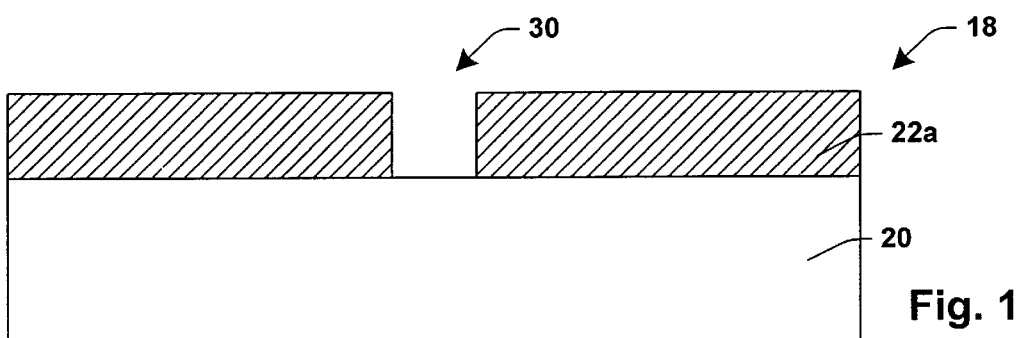
FIG. 1b is a schematic illustration of the photoresist layer of FIG. 1a patterned in accordance with a conventional damascene process.
Figure 1C:
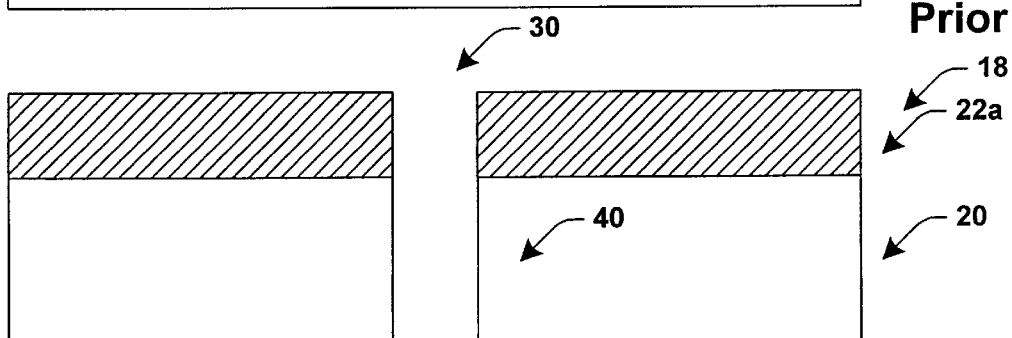
FIG. 1c is a schematic illustration of the structure of FIG. 1b after the oxide layer has been etched in accordance with a conventional damascene process.
Figure 1D:
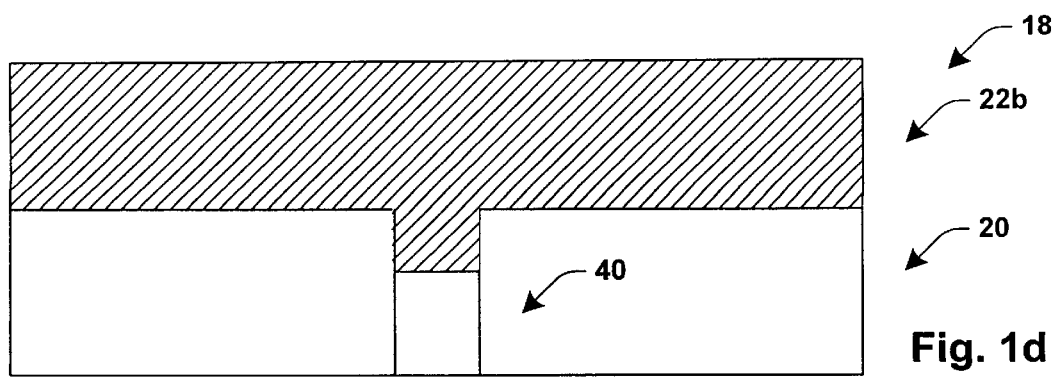
FIG. 1d is a schematic illustration of the structure of FIG. 1c after additional photoresist is applied thereon in accordance with a conventional damascene process.
Figure 1E:
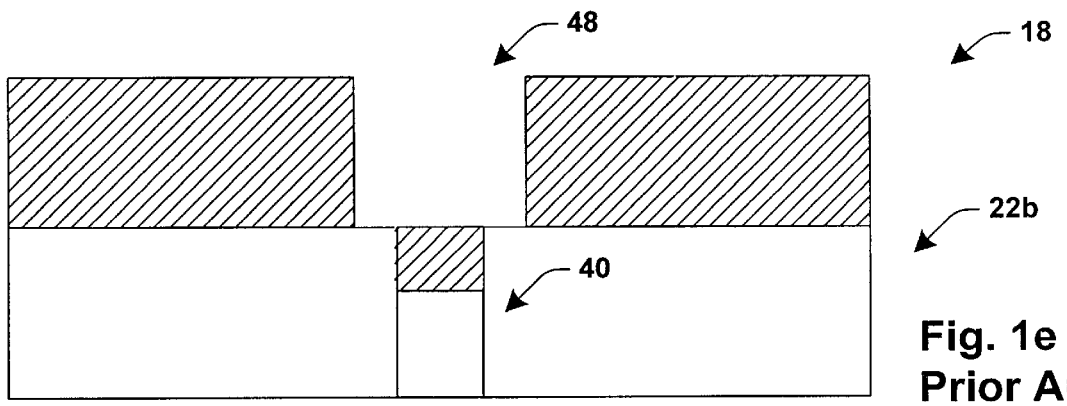
FIG. 1e is a schematic illustration of the structure of FIG. 1d after the additional photoresist has been patterned in accordance with a conventional damascene process.
Figure 1F:
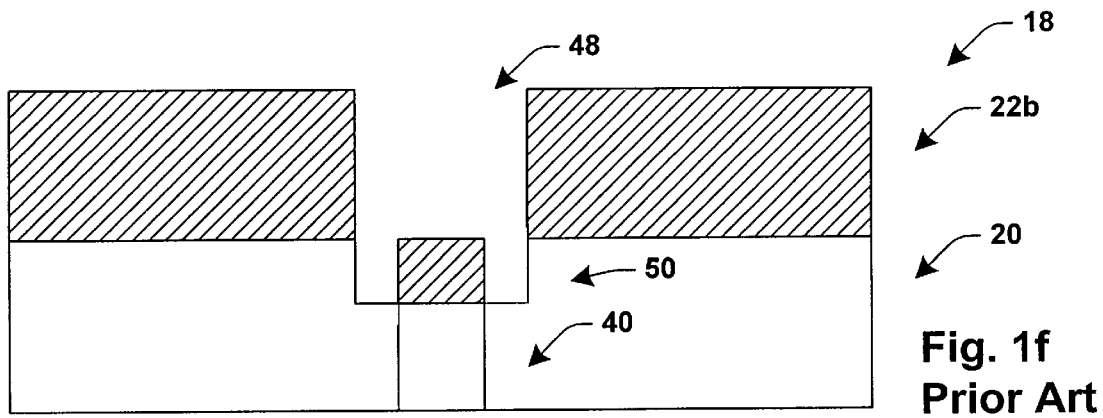
FIG. 1f is a schematic illustration of the structure of FIG. 1e after the oxide layer is etched for a second time in accordance with a conventional damascene process.
Figure 1G:
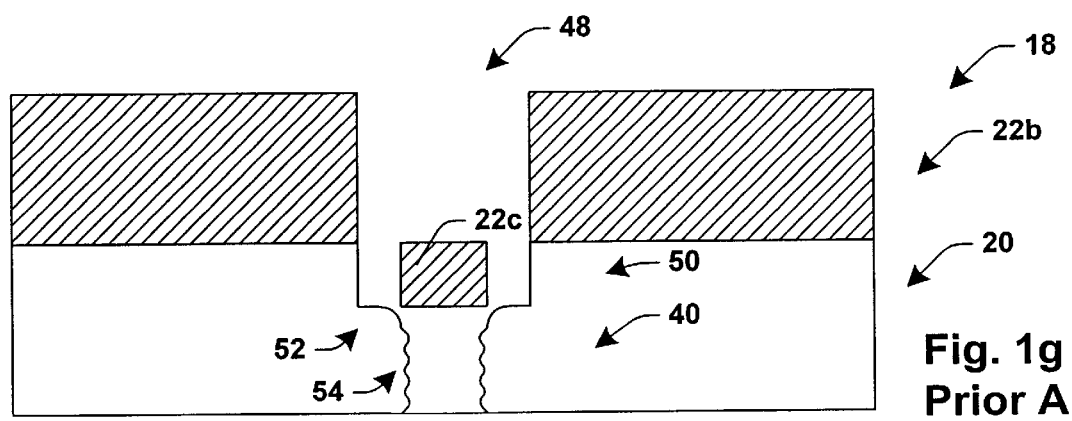
FIG. 1g is a schematic illustration of the structure of FIG. 1e after etchant gases from the second etch step damaged edges and sidewalls of the via in accordance with a conventional damascene process.

The present invention will now be described with reference to the drawings, wherein like reference numerals are used to refer to like elements throughout.

Figure 2:
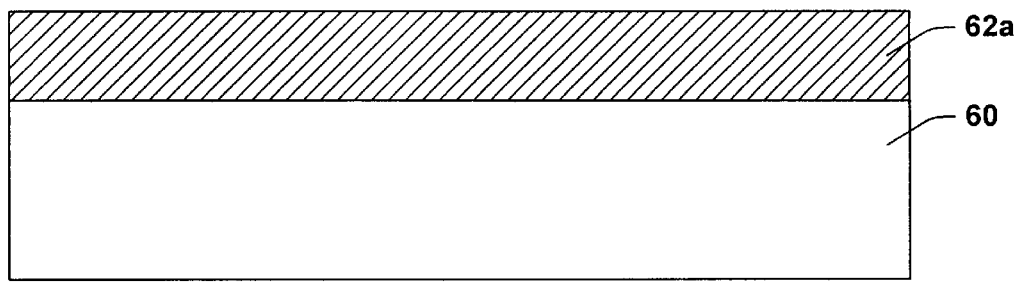
FIG. 2 is a schematic illustration of an oxide layer covered with a photoresist layer in accordance with the present invention.
Figure 3:
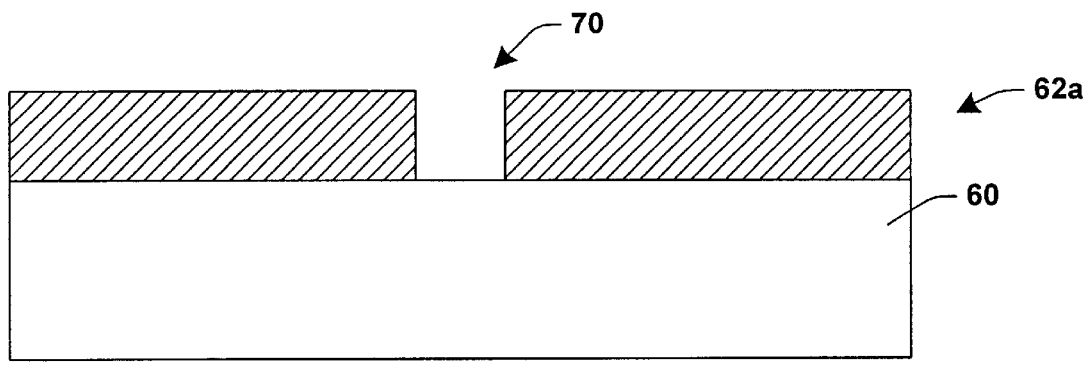
FIG. 3 is a schematic illustration of the structure of FIG. 2 after the photoresist layer has been patterned in accordance with the present invention.
Figure 4:
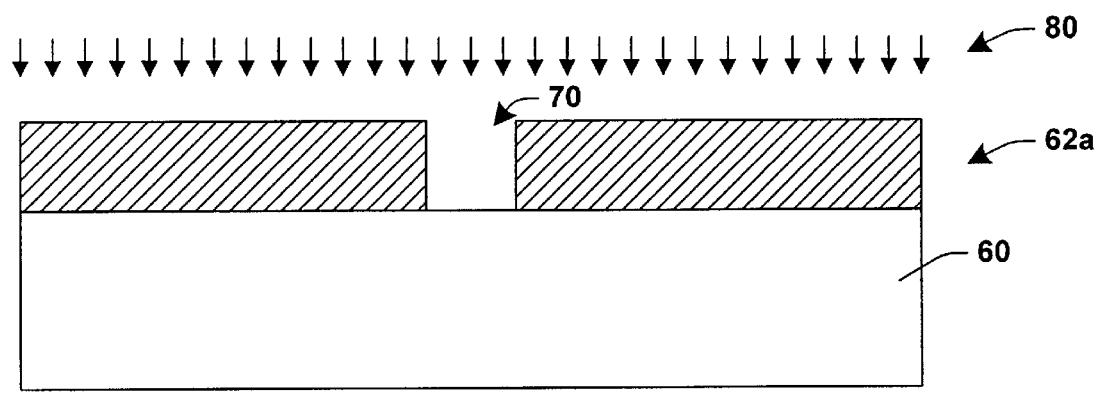
FIG. 4 is a schematic illustration of the structure of FIG. 3 undergoing an etching step in accordance with the present invention.
Figure 5:
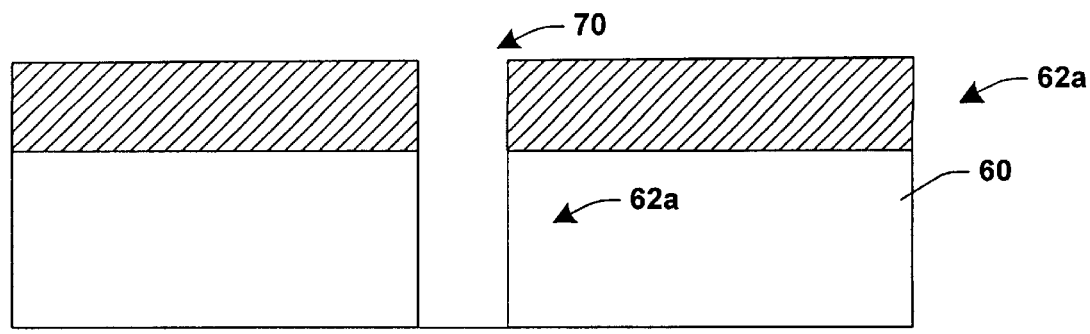
FIG. 5 is a schematic illustration of the structure of FIG. 4 after the etching step is substantially complete in accordance with the present invention.

FIG. 2 illustrates an insulator layer 60 which is formed on a semiconductor substrate (not shown). Any suitable technique (e.g., thermal oxidation, plasma enhanced chemical vapor deposition (CVD), thermal enhanced CVD and spin on techniques) may be employed in forming the insulating layer 60. Preferably, the insulating layer 60 is silicon dioxide ($SiO_2$) with a thickness of about 0.8 to 1.0 microns. Other usuable insulating materials are silicon nitride ($Si_3N_4$), (SiN), silicon oxynitride ($SiO_xN_y$), and fluonated silicon oxide ($SiO_xF_y$), and polyimide(s). A photoresist layer 62a is formed on the insulating layer 60. The photoresist layer 62a is patterned using conventional techniques to form a first opening 70 (FIG. 3). The size of the first opening 70 is about the size of the ultimate via. An etch step 80 (e.g., anisotropic reactive ion etching (RIE)) (FIG. 4) is performed to form a via 90 (FIG. 5) in the insulating layer 60. For example, the insulating layer 60 at the first opening 70 is anisotripically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 62a to thereby create the via 90 in the insulating layer 60.

Figure 6:
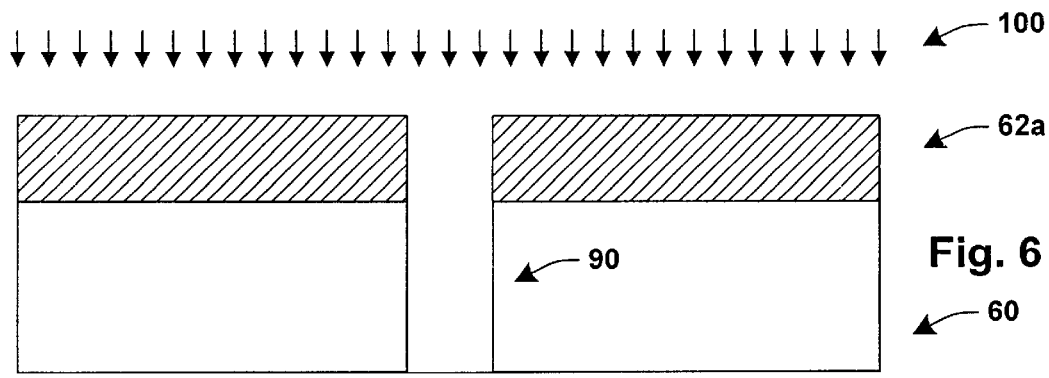
FIG. 6 is a schematic illustration of the structure of FIG. 5 undergoing a stripping step to remove excess photoresist in accordance with the present invention.
Figure 7:
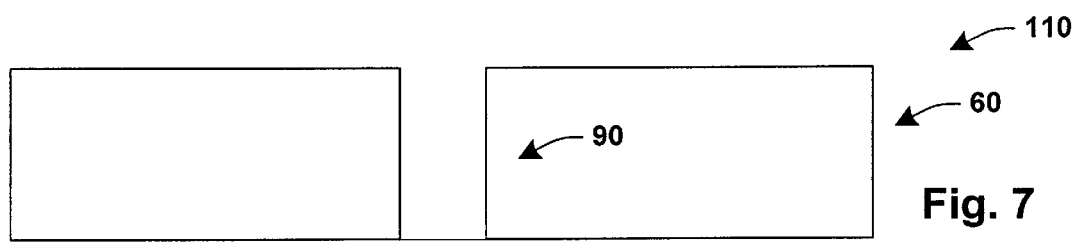
FIG. 7 is a schematic illustration of the structure of FIG. 6 after the stripping step is substantially complete in accordance with the present invention.
Figure 8:
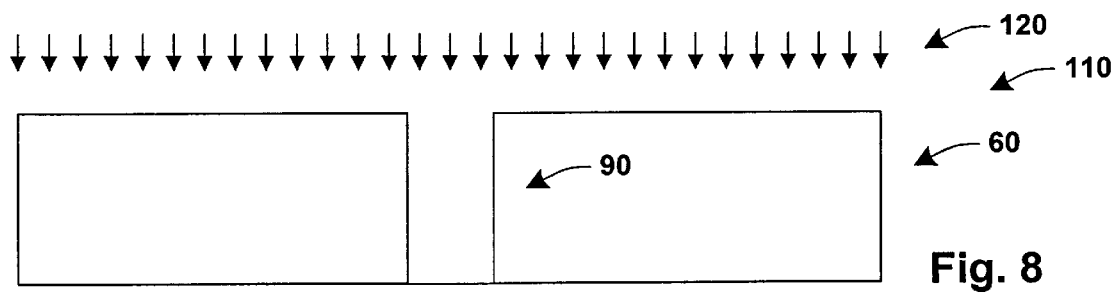
FIG. 8 is a schematic illustration of the structure of FIG. 7 undergoing a step to form a conformal insulating layer in accordance with the present invention.

FIG. 6 illustrates a stripping step 100 (e.g., ashing in an $O_2$ plasma) to remove remaining portions of the photoresist layer 62a. FIG. 7 illustrates a partially complete dual damascene structure 110 after the stripping step 100 is substantially complete. Next, a deposition step 120 is performed on the structure 110 to form a protective conformal layer 130 (FIG. 9) over the structure 110.

In one embodiment, the protective conformal layer 130 includes nitride (referenced as 130'). The deposition step 120 performed on the structure 110 includes a chemistry suitable to form a nitride layer conformal to the exposed surface of the structure 110. It is to be appreciated that one skilled in the art could readily tailor without undue experimentation a suitable chemistry to form the conformal nitride coating 130'. The chemistry and duration thereof may be suitably tailored to form the conformal nitride coating 130' at substantially any desired thickness (e.g., between about the range of 10–1000 Å).

According to alternative embodiments of the present invention, the protective conformal layer 130 is a carbon/oxygen based polymer (referenced by 130") conformal to the exposed surface of the structure 110. The structure 110 is exposed to at least one of a $CHF_3$ chemistry, an HBR chemistry, a $CH_3F$ chemistry, and a $CH_2F_2$ chemistry to form the conformal polymer coating 130" on the structure 110. Oxygen based reactive gases are reduced as compared to a typical etch chemistry so that the conformal polymer coating 130" is formed over the structure 110.

One specific example of a suitable chemistry to form the conformal polymer layer 130" includes using a relatively high pressure of 50–100 mT, relatively low power of less than or equal to 500 W, and a temperature of below 80° C. It is to be appreciated that one skilled in the art could readily tailor without undue experimentation a suitable chemistry to form the conformal polymer coating 130". As discussed in greater detail below, the etch chemistry and duration thereof may be suitably tailored to form the conformal polymer layer 130" at substantially any desired thickness (e.g., between about the range of 10–1000 Å).

Below are some specific examples of chemistries that may be employed in forming the conformal polymer layer 130".

EXAMPLE 1

A MERIE method is used with $CHF_3$ (50 to 200 sccm) with reactant gases of: Ar (100 to 500 sccm) and $O_2$ (10 to 50 sccm) at a power level within the range of about 100 to 500 W and pressure within the range of about 60 to 100 mT.

EXAMPLE 2

A MERIE method is used with HBR (100 to 250 sccm) with reactant gases of: Ar (100 to 500 sccm) at a power level within the range of about 100 to 500 W, and pressure within the range of about 500 to 100 mT.

EXAMPLE 3

A MERIE method is used with $CH_3F$ (50 to 250 sccm) with reactant gases of: Ar (50 to 200 sccm) and $N_2$ (10 to 50 sccm) at a power level within the range of about 100 to 500 W, and pressure within the range of about 50 to 100 mT.

EXAMPLE 4

A MERIE method is used with $CH_2F_2$ (100 to 200 sccm) with reactant gases of: Ar (50 to 200 sccm) and $N_2$ (10 to 50 sccm) at a power level within the range of about 100 to 500 W, and pressure within the range of about 50 to 100 mT.

Figure 9:
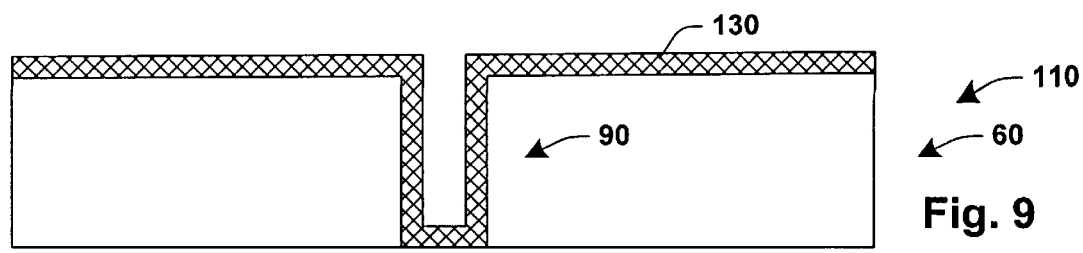
FIG. 9 is a schematic illustration of the structure of FIG. 8 after the insulating conformal layer is substantially complete in accordance with the present invention.

FIG. 9 illustrates the structure 110 after the deposition step 120 is substantially complete. The protective layer 130 is conformal to the exposed surface of the structure 110 with a substantially uniform thickness.

Figure 10:
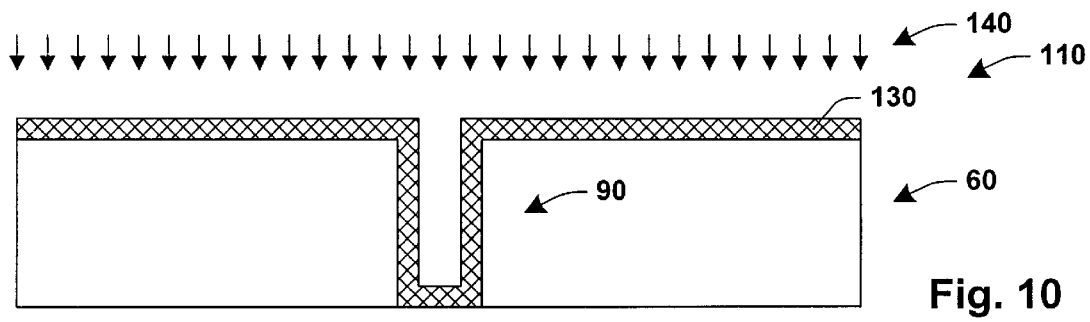
FIG. 10 is a schematic illustration of the structure of FIG. 9 undergoing a etching step to remove excess portions of the conformal insulating layer in accordance with the present invention.

FIG. 10 illustrates a directional etch step 140 being performed to remove a predetermined thickness of the protective layer 130. An etch chemistry including $CHF_3$, $O_2$, Ar and $CF_4$, for example, is employed to perform a dry directional etch of the protective layer 130. Preferably, the directional etch 140 is performed to remove an amount of the protective layer 130 equivalent to the conformal thickness of the protective layer 130.

Figure 11:
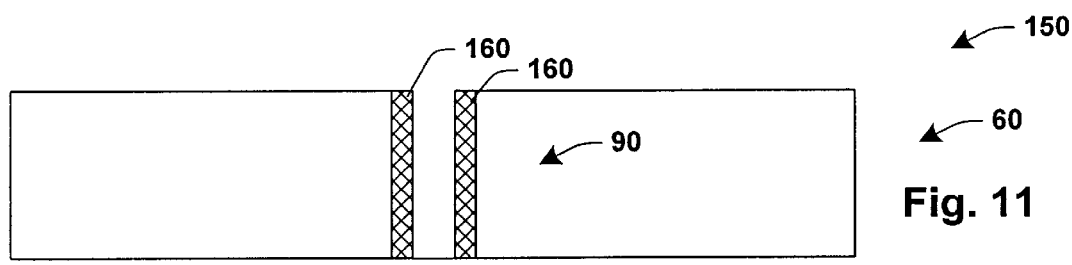
FIG. 11 is a schematic illustration of the structure of FIG. 10 after the etching step is substantially complete in accordance with the present invention.
Figure 14:
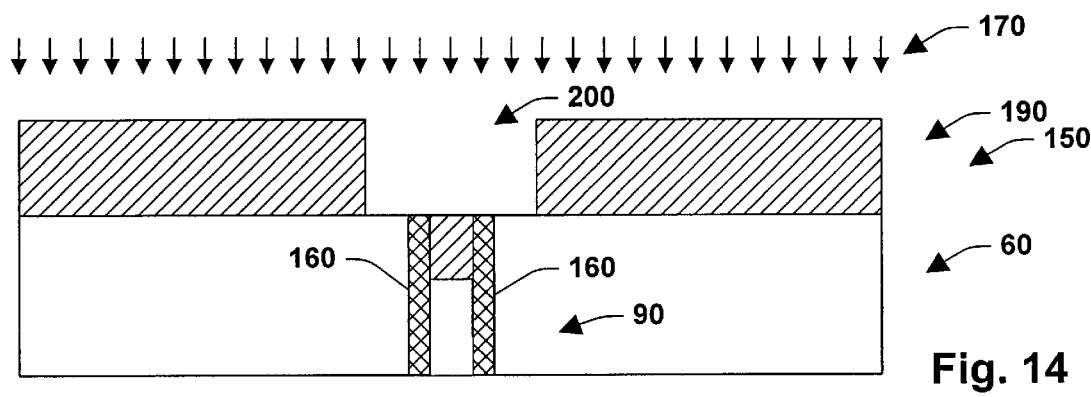
FIG. 14 is a schematic illustration of the structure of FIG. 13 undergoing a second oxide layer etch in accordance with the present invention.

Substantial completion of the etch step 140 results in a structure 150 shown in FIG. 11. The structure 150 includes protective sidewalls 160 which protect edges 162 (FIG. 15) and sidewalls 164 (FIG. 15) of the via 90 from a second etch step 170 (FIG. 14) to form a conductive line trench 180 (FIG. 15).

Figure 12:
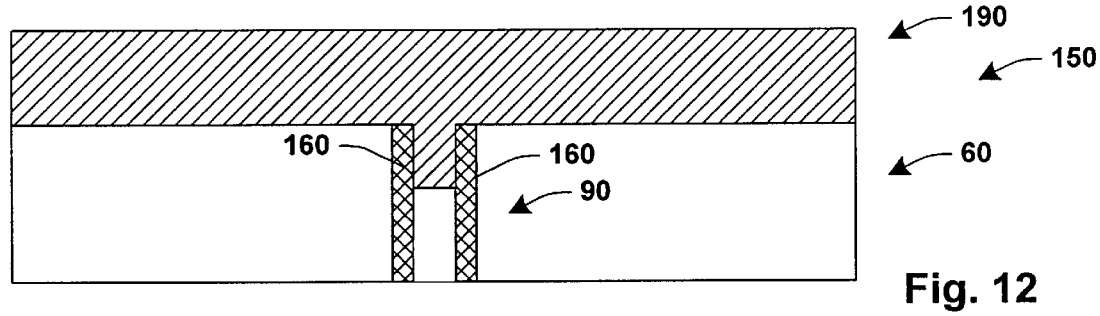
FIG. 12 is a schematic illustration of the structure of FIG. 11 after a second photoresist layer has been formed on the structure in accordance with the present invention.
Figure 13:
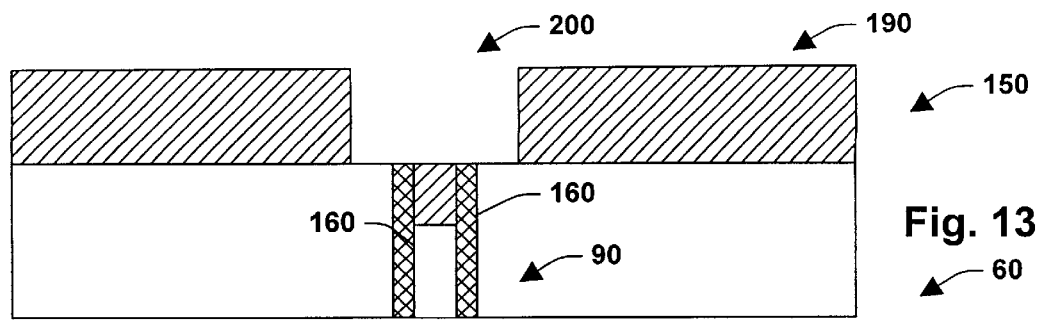
FIG. 13 is a schematic illustration of the structure of FIG. 12 after the second photoresist layer has been patterned in accordance with the present invention.

FIG. 12 illustrates a second photoresist layer 190 formed on the structure 150. The second photoresist layer 190 is patterned to form a second opening 200 (FIG. 13) about the size of the ultimate trench 180. The second etch step (preferably an anisotropic RIE step) 170 (FIG. 14) is performed to form the trench 180 (FIG. 15) in the insulating layer 60.

Figure 1H:
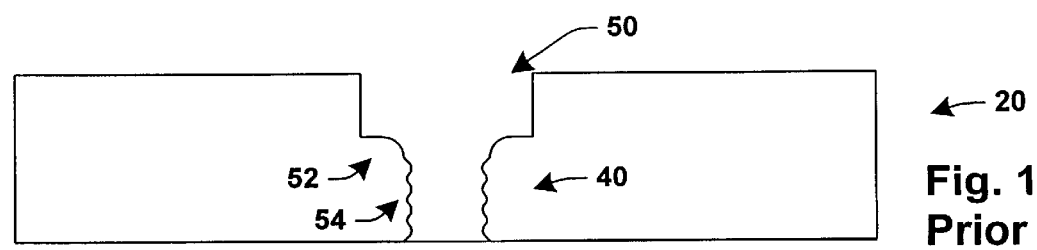
FIG. 1h is a schematic illustration of the structure of FIG. 1g after remaining portions of photoresist are removed in accordance with a conventional damascene process.
Figure 15:
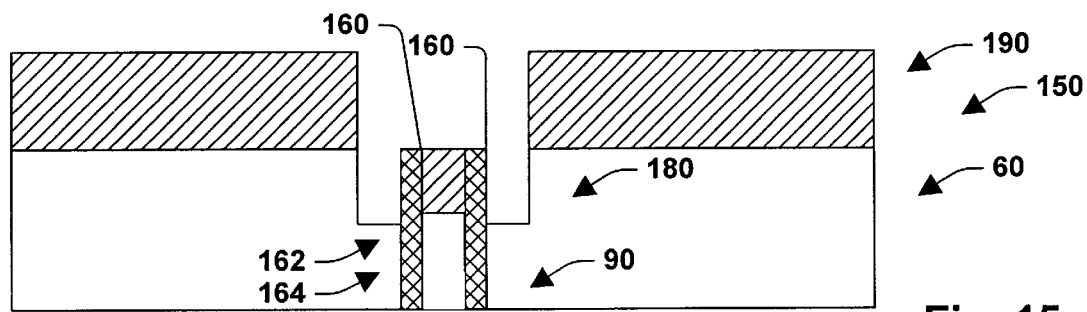
FIG. 15 is a schematic illustration of the structure of FIG. 14 after the second oxide layer etch is substantially complete in accordance with the present invention.
Figure 16:
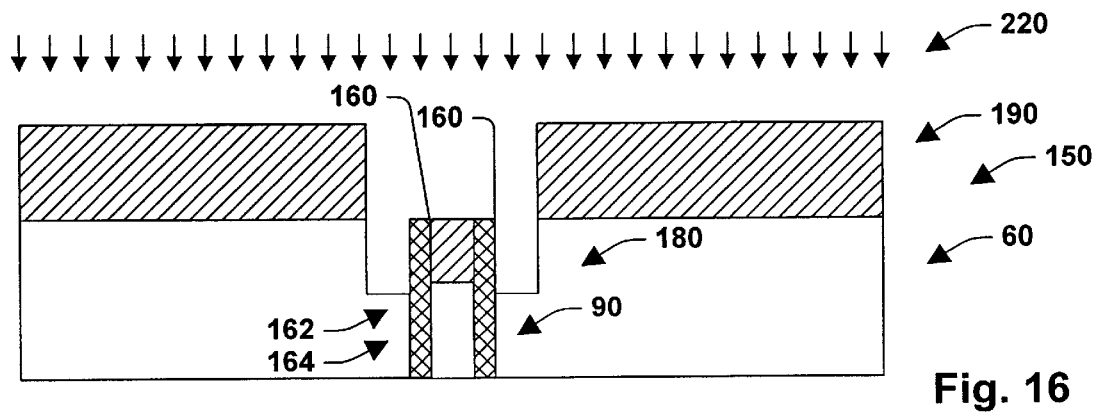
FIG. 16 is a schematic illustration of the structure of FIG. 15 undergoing a stripping step to remove excess portions of photoresist and insulating material in accordance with the present invention.
Figure 17:
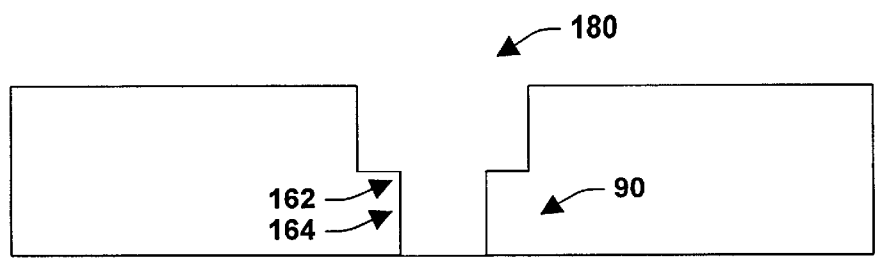
FIG. 17 is a schematic illustration of a substantially complete dual damascene structure in accordance with the present invention.

Turning now to FIG. 15, the sidewalls 160 resulting (from the conformal protective layer 130) protect the edges 162 and sidewalls 164 of the via 90 thus mitigating damage thereto from the second etch step 170. FIG. 16 illustrates a cleaning step 220 to remove remaining portions of photoresist 190 and the conformal protective sidewalls 160 from the structure 150. FIG. 17 illustrates the dual damascene structure 150 in relevant part. The structure 150 exhibits well defined edges and sidewalls for the via 90 as compared to the structure 20 (FIG. 1h) formed using conventional dual damascene techniques.

Thereafter, the dual damascene structure 150 is filled with a metal (e.g., aluminum, aluminum alloy, copper, copper alloy, tungsten, tungsten alloy) so as to form a conductive via and conductive line.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of fabricating interconnecting lines and vias in a layer of insulating material comprising the steps of:
    forming a via in the layer of insulating material;
    forming a protective material so as to be conformal to at least edges and sidewalls of the via, the protective material facilitating shielding of at least edges and sidewalls of the via from a trench etch step; and
    performing the trench etch step to form a trench opening in the insulating material the trench opening being formed above at least a portion of the via.

2. The method of claim 1, the insulating material including at least one of silicon oxide, silicon dioxide, silicon nitride ($Si_3N_4$), (SiN), silicon oxynitride, ($SiO_xN_y$), fluoronated silicon oxide ($SiO_xF_y$), and polyimide(s).

3. The method of claim 1, further including the step of filling the via and conductive line opening with a metal.

4. The method of claim 3, the metal including at least one of: aluminum, aluminum alloy, copper, copper alloy, tungsten, tungsten alloy.

5. The method of claim 1 further including the step of forming the protective layer to include nitride.

6. The method of claim 1 further including the step of forming the protective layer to include a polymer.

7. The method of claim 6 further including the step of using at least one of a $CHF_3$ chemistry, an HBR chemistry, a $CH_3F$ chemistry, and a $CH_2F_2$ chemistry in forming the protective layer.

8. The method of claim 6 further including the step of using $CHF_3$ (50 to 200 sccm) with reactant gases of: Ar (100 to 500 sccm) and $O_2$ (10 to 50 sccm) at a power level within the range of about 100 to 500 W and pressure within the range of about 60 to 100 mT in forming the protective layer.

9. The method of claim 6 further including the step of using HBR (100 to 250 sccm) with reactant gases of: Ar (100 to 500 sccm) at a power level within the range of about 100 to 500 W, and pressure within the range of about 500 to 100 mT in forming the protective layer.

10. The method of claim 6 further including the step of using $CH_3F$ (50 to 250 sccm) with reactant gases of: Ar (50 to 200 sccm) and $N_2$ (10 to 50 sccm) at a power level within the range of about 100 to 500 W, and pressure within the range of about 50 to 100 mT in forming the protective layer.

11. The method of claim 6 further including the step of using $CH_2F_2$ (100 to 200 sccm) with reactant gases of: Ar (50 to 200 sccm) and $N_2$ (10 to 50 sccm) at a power level within the range of about 100 to 500 W, and pressure within the range of about 50 to 100 mT in forming the protective layer.

12. A method for fabricating interconnecting lines and vias in a layer of insulating material comprising the steps of:

forming a first photoresist layer on the insulating material, the insulating material including at least one of: silicon oxide (SiO), silicon dioxide ($SiO_2$), silicon nitride ($Si_3N_4$), (SiN), silicon oxynitride ($SiO_xN_y$), fluonated silicon oxide ($SiO_xF_y$), and polyimide(s);

patterning the first photoresist layer to define a via;

forming the via in the layer of insulating material;

forming a protective material so as to be conformal to at least edges and sidewalls of the via, the protective material facilitating shielding of at least the edges and sidewalls of the via from a trench etch step, the protective material including at least one of: a nitride and a polymer;

removing excess portions of the first photoresist layer and protective material;

forming a second photoresist layer on the insulating material;

patterning the second photoresist layer to define a trench;

performing the trench etch step to form the trench in the insulating material; and filling the via and trench with a conductive metal.

13. The method of claim 12 wherein the conductive metal includes at least one of: aluminum, aluminum alloy, copper, copper alloy, tungsten, and tungsten alloy.

14. The method of claim 12 further including the step of using at least one of a $CHF_3$ chemistry, an HBR chemistry, a $CH_3F$ chemistry, and a $CH_2F_2$ chemistry in forming the protective layer.

* * * * *

UNITED STATES PATENT AND TRADEMARK OFFICE
CERTIFICATE OF CORRECTION

PATENT NO. : 6,187,666 B1
DATED : February 13, 2001
INVENTOR(S) : Bhanwar Singh, et al.

It is certified that error appears in the above-identified patent and that said Letters Patent is hereby corrected as shown below:

Column 2,
Line 60, please replace "via The" with -- via. The --.
Line 63, please replace "via The" with -- via. The --.

Signed and Sealed this

Sixth Day of November, 2001

Attest:

NICHOLAS P. GODICI
Attesting Officer
Acting Director of the United States Patent and Trademark Office